United States Patent [19]
Baroni et al.

[11] Patent Number: 6,061,286
[45] Date of Patent: May 9, 2000

[54] MEMORY DEVICE WITH REDUCED POWER DISSIPATION

[75] Inventors: Andrea Baroni; Danilo Rimondi, both of Mozzo; Michele Taliercio, Arluno; Cosimo Torelli, Tortona, all of Italy

[73] Assignee: SGS-Thomson Miroelectronics S.r.l., Agrate Brianza, Italy

[21] Appl. No.: 09/053,720

[22] Filed: Apr. 1, 1998

[30] Foreign Application Priority Data

Apr. 3, 1997 [EP] European Pat. Off. .............. 97830160

[51] Int. Cl.⁷ ...................................................... G11C 7/00
[52] U.S. Cl. ........................................... 365/203; 365/210
[58] Field of Search .................... 365/203, 210, 365/233

[56] References Cited

U.S. PATENT DOCUMENTS

| | | | |
|---|---|---|---|
| 5,029,135 | 7/1991 | Okubo | 365/203 |
| 5,751,634 | 5/1998 | Itoh | 365/185.17 |

FOREIGN PATENT DOCUMENTS

| | | | |
|---|---|---|---|
| 0 383 080 | 8/1990 | European Pat. Off. | G11C 11/40 |
| 0 422 939 | 4/1991 | European Pat. Off. | G11C 7/00 |
| 0 432 482 | 6/1991 | European Pat. Off. | G11C 7/00 |
| 0 638 903 | 2/1995 | European Pat. Off. | G11C 7/00 |

OTHER PUBLICATIONS

European Search Report from European Patent Application No. 97830160.4, filed Apr. 3, 1997.

*Primary Examiner*—David Nelms
*Assistant Examiner*—Anh Phung
*Attorney, Agent, or Firm*—Wolf, Greenfield & Sacks, P.C.; James H. Morris; Theodore E. Galanthay

[57] ABSTRACT

A memory device comprises an array of memory cells arranged in rows and columns, a plurality of gates for transmitting respective selection outputs of a row decoder to respective rows, a dummy column of dummy memory cells substantially identical to the memory cells, precharge means for precharging the columns and the dummy column at a precharge potential when no row is selected, and programming means for setting selected columns at respective programming potentials. The device comprises dummy memory cell preset means for presetting the dummy memory cells in a first logic state when no row is selected, dummy column programming means for setting the dummy column at a prescribed programming potential corresponding to a second logic state opposite to the first logic state, and first detector means for detecting that the dummy column has discharged from the precharge potential to the prescribed programming potential and for consequently enabling said plurality of gates. Each of the gates has an input coupled to a respective dummy memory cell so that the gate is disabled as soon as the respective dummy memory cell has switched from the first logic state to the second logic state.

28 Claims, 3 Drawing Sheets

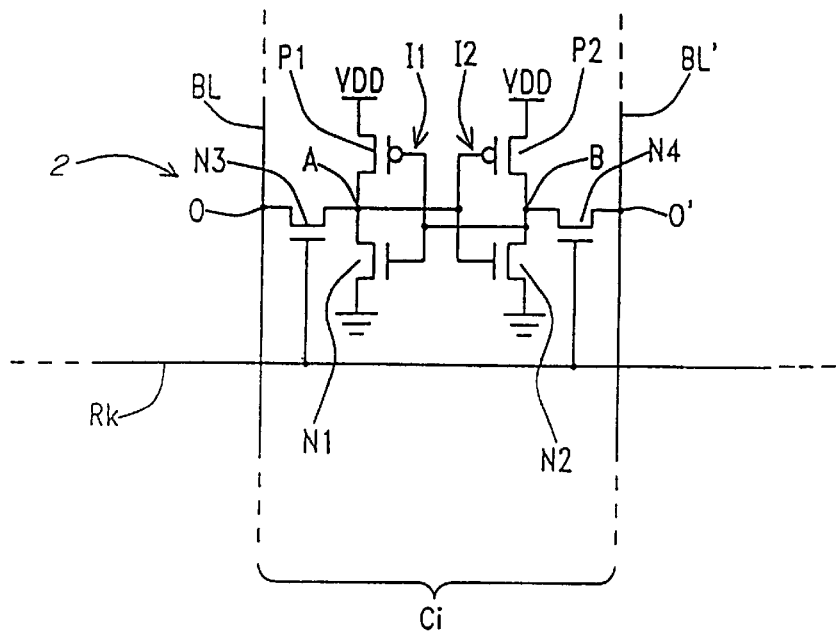
FIG. 3
(PRIOR ART)
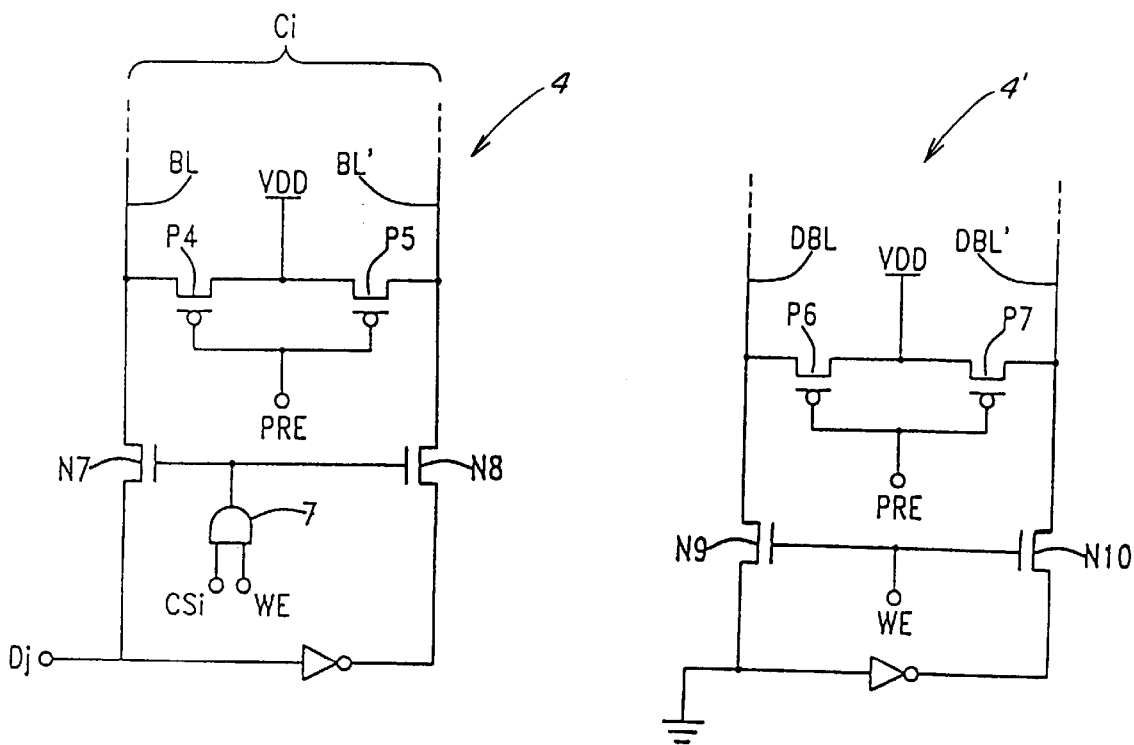
FIG. 4          FIG. 5

MEMORY DEVICE WITH REDUCED POWER DISSIPATION

BACKGROUND OF THE INVENTION

1. Field of the Invention

The present invention relates to the field of integrated memory circuits. More particularly, the invention relates to integrated Random Access Memories (RAMs), for example static RAMs.

2. Discussion of the Related Art

Conventionally, a memory device such as a static RAM includes four main circuit blocks: a bidimensional array of readable and writable memory cells arranged in rows and columns, a row decoder circuit block for selecting the desired rows inside the array, a column decoder circuit block for selecting the desired columns of the array, and read/write circuits.

In general, the memory cell array includes n rows and m columns. Usually, an information word of p bits is stored in the memory cells belonging to a same row. When the memory device is operated in active mode (for reading or programming), the row decoder circuits select one row of the array (i.e., m memory cells are simultaneously selected) and the column decoder circuit selects the desired p columns among the m columns of the array; hence, m memory cells are selected but only a subset p of them is actually accessed.

In active mode, the current consumption of the memory array is therefore given by:

$$I_{ddr}=m \times C_b \times \Delta V_r$$

for the read operation, where $\Delta V_r$ is the voltage swing of the columns, and $$I_{ddw}=p \times C_b \times \Delta V_w+(m-p) \times C_b \times \Delta V_r$$

for the write (programming) operation, where $C_b$ is the capacitance of each column, $\Delta V_w$ is the voltage swing of the p columns of the memory cells to be programmed, and $\Delta V_r$ is the voltage swing of the remaining unselected columns.

The most common approach to reduce the current consumption involves reducing the column capacitance $C_b$.

Another approach which can be used, also in combination with the previous one, involves partitioning the memory cell array into multiple blocks that are selectively activated. In this way, the number m of cells connected to each row is reduced.

Still another technique provides for limiting the voltage swing $\Delta V_r$ by controlling the width of the time pulse during which a row is selected. This technique, however, is used only for the read operation.

In view of the state of the art described, it is an object of the present invention to provide a memory device having a low current consumption when it is accessed in write mode.

SUMMARY OF THE INVENTION

According to the present invention, this and other objects are attained by a memory device comprising an array of memory cells arranged in rows and columns, a plurality of gates for transmitting respective selection outputs of a row decoder to respective rows, a dummy column of dummy memory cells substantially identical to the memory cells, precharge means for precharging the columns and the dummy column at a precharge potential when no row is selected, and programming means for setting selected columns at respective programming potentials. The memory device further includes dummy memory cell preset means for presetting the dummy memory cells in a first logic state when no row is selected, dummy column programming means for setting the dummy column at a prescribed programming potential corresponding to a second logic state opposite to the first logic state, and first detector means for detecting that the dummy column has discharged from the precharge potential to the prescribed programming potential and for consequently enabling the plurality of gates. Each of the gates has an input coupled to a respective dummy memory cell so that the gate is disabled as soon as the respective dummy memory cell has switched from the first logic state to the second logic state.

The memory device of the present invention has a lower current consumption than conventional devices; in fact, when the memory device is programmed, the desired row remains selected for only a short time necessary for the memory cells of the selected columns to switch to the desired state. The dummy memory cells are used to monitor the switching time of the memory cells. By reducing the time that a row is enabled, the unselected columns are thus not completely discharged, therefore reducing overall current consumption.

BRIEF DESCRIPTION OF THE DRAWINGS

These and other features and advantages of the present invention will be made apparent by the following detailed description of a particular embodiment, illustrated by way of a non-limiting example in the accompanying drawings, wherein:

FIG. 3 shows the circuit diagram of a memory cell;

FIG. 4 is a schematic circuit diagram of a precharge and programming circuit for a memory cell column of the memory device shown in FIG. 2;

FIG. 5 is a schematic circuit diagram of a precharge and programming circuit for a dummy column of the memory device of FIG. 2.

DETAILED DESCRIPTION

Figure 1:
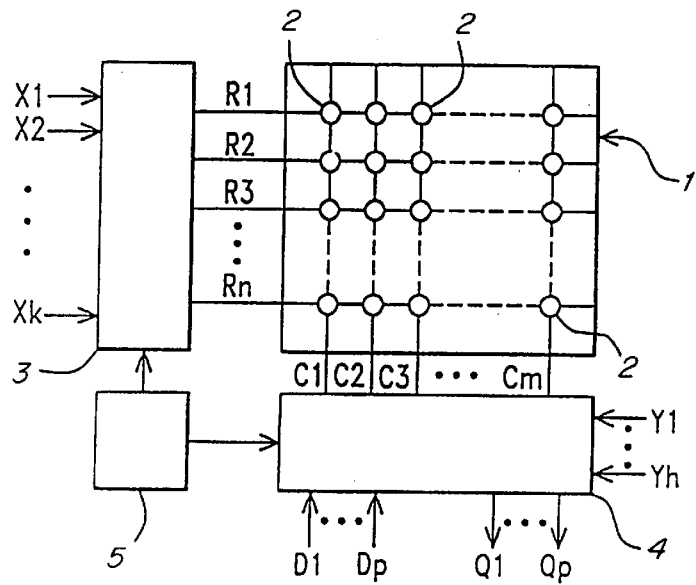
FIG. 1 is a schematic block diagram of a memory device.

FIG. 1 schematically shows the main circuit blocks of a memory device according to the present invention, for example, a static RAM (SRAM). The memory device includes a bidimensional array 1 of readable and programmable memory cells 2. Conventionally, within the array 1, the memory cells 2 are arranged in n rows R1–Rn and m columns C1–Cm.

A row decoder circuit 3 is supplied with row address signals X1–Xk and selects one row R1–Rn of the array, depending on the specific logic value of signals X1–Xk. Similarly, a column decoder circuit 4 is supplied with column address signals Y1–Yh and selects a desired group of p columns of the array, according to the logic value of signals Y1–Yh. In the schematic diagram of FIG. 1, block 4 also includes the sensing circuits necessary for reading the selected memory cells 2 and for outputting read data Q1–Qp. Block 4 also includes programming circuits for programming the memory cells of the selected columns according to the logic states of data signals D1–Dp. A control circuit 5 is provided for controlling blocks 3 and 4 in accordance with the particular operation mode of the memory device.

Figure 2:
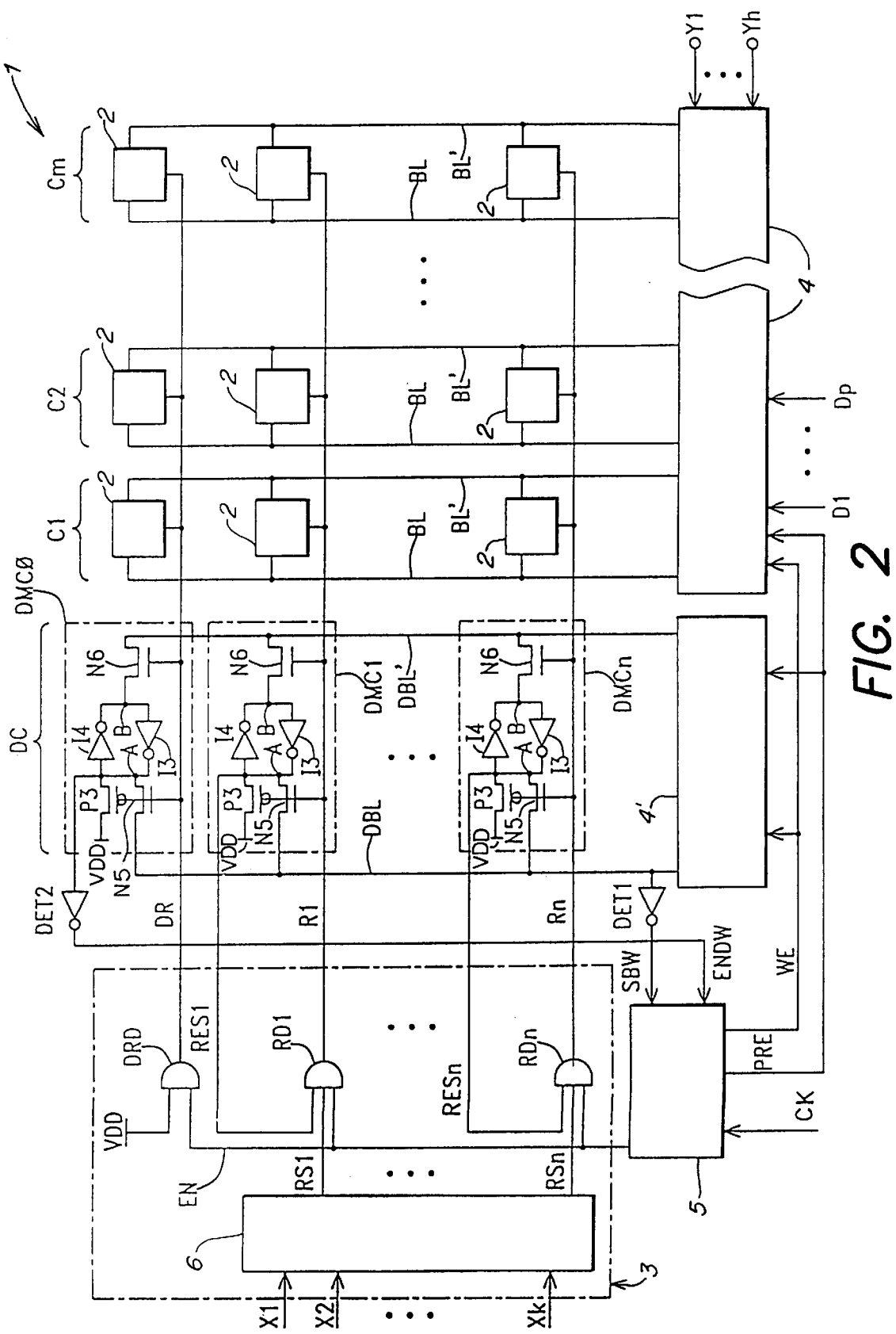
FIG. 2 is a more detailed circuit diagram of the memory device of FIG. 1, showing several features of the present invention.

FIG. 2 shows in more detail the structure of the memory array 1 when the memory device is a static RAM. Each column C1–Cm includes a pair of complementary bit lines BL and BL'. The memory cells 2 may be, for example, six transistor memory cells (6T memory cells).

The known circuit structure of the 6T memory cells 2 is shown in FIG. 3 (prior art). The memory cell 2 conventionally includes two inverters I1 and I2, for example, of the CMOS type. Inverter I1 includes a P-channel pull-up MOSFET P1 and an N-channel pull-down MOSFET N1 connected in series between a voltage supply VDD and ground. Inverter I2 similarly includes a P-channel pull-up MOSFET P2 and an N-channel pull-down MOSFET N2 connected in series between VDD and ground. An output node A of inverter I1 is connected to the input node of inverter I2 (i.e., to the gates of P2 and N2); similarly, an output node B of inverter I2 is connected to an input node of inverter I1 (i.e., to the gates of P1 and N1). The memory cell further includes first and second selection transistors N3 and N4, formed, for example, by N-channel MOSFETs. Transistor N3 couples node A to a first input/output node O of the memory cell 2, while N4 couples node B to a second, logically complemented, input/output node O' of the memory cell. Node O is connected to a first bit line BL of the pair of complementary bit lines of a generic column Ci of the memory array, and node O' is connected to a second bit line BL' of the pair. The gates of the selection transistors N3 and N4 are both connected to a generic row Rk of the memory array.

Referring now again to FIG. 2, the memory array 1 includes, in addition to rows R1–Rn and columns C1–Cm, a dummy row DR and a dummy column DC of memory cells. The dummy column DC includes (n+1) dummy memory cells DMC0–DMCn, each of which are similar to the memory cells 2. The dummy memory cells include two cross-coupled inverters I3 and I4 (for example, of the CMOS type) and two selection transistors N5 and N6 for coupling the output nodes A and B of the inverters to a pair of complementary dummy bit lines DBL and DBL' of the dummy column. The gates of the selection transistors N5 and N6 of dummy memory cell DMC0 are connected to the dummy row DR and the gates of the selection transistors N5 and N6 of dummy memory cells DMC1–DMCn are connected to a respective one of rows R1–Rn of the memory array. Each dummy memory cell DMC0–DMC1 further includes a pre-set P-channel MOSFET P3 that couples node A to the voltage supply VDD. For dummy memory cell DMC0, the gate of the preset transistor P3 is connected to the dummy row DR, and for dummy cells DMC1–DMCn, the gate of transistor P3 is connected to a respective one of the rows R1–Rn. The dummy row DR includes the dummy memory cell DMC0 and m memory cells 2.

As shown in FIG. 2, the row decoder circuit 3 includes a predecoder 6 supplied by the row address signals X1–Xk, having n output signals RS1–RSn that are individually activated to select one of the n rows R1–Rn of the array. The row decoder circuit 3 further includes n row drivers RD1–RDn, each controlling the selection of a respective row R1–Rn. Each driver includes an AND gate having a first input supplied with a respective one of signals RS1–RSn, a second input supplied with an enable signal EN generated by the control circuit 5, and a third input supplied with a respective signal RES1–RESn taken from node A of the dummy cell DMC1–DMCn belonging to the respective row. The row decoder circuit 3 also includes a dummy row driver DRD substantially formed by an AND gate having a first input supplied with signal EN and a second input connected to VDD.

The control circuit 5 is supplied with a clock signal CK, and is further supplied with a signal SBW generated by a first level detector DET1 detecting the voltage level of the dummy bit line DBL of the dummy column DC, and with a signal ENDW generated by a second level detector DET2 detecting the voltage level of node A of the dummy cell DMC0 belonging to the dummy row DR. The control circuit 5 generates, in addition to signal EN, a precharge signal PRE and a write signal WE supplied to the column decoder circuit 4. Signals PRE and WE are also supplied to a write and precharge circuit 4' for the dummy column DC.

FIG. 4 schematically shows the circuit structure of a write and precharge circuit of the column decoder circuit 4. There are m such circuits provided in the column decoder circuit, each one associated to a respective column Ci of the memory array. Signal PRE controls first switching means, formed for example by P-channel MOSFETs P4 and P5, for selectively connecting the complementary bit lines BL and BL' of the column to VDD. Second switching means are also provided, for example represented by N-channel MOSFETs N7 and N8, for selectively connecting the bit lines BL and BL' of the column Ci to a data signal Dj and, respectively, to the logic complement thereof, data signal Dj is one of the p data signals D1–Dp shown in FIG. 1. N-channel MOSFETs N7 and N8 are controlled by an AND gate 7 supplied with signal WE and with a column selection signal CSi. Signal CSi is activated to select the respective column Ci and is generated by a column predecoder (not shown), included in the column decoder circuit 4, that is supplied with the columns address signals Y1–Yh, as shown in FIG. 1. The column decoder circuit 4 further includes, in addition to the m write and precharge circuits of FIG. 4 and the predecoder circuit, sensing circuits for reading the information stored in the selected memory cells.

FIG. 5 schematically shows the structure of the dummy write and precharge circuit 4' for the dummy column DC. Similarly to the circuit of FIG. 4, first switching means formed by P-channel MOSFETs P6 and P7, controlled by signal PRE, are provided to selectively connect the complementary dummy bit lines DBL and DBL' to VDD. Second switching means, formed by N-channel MOSFETs N9 and N10 and controlled by signal WE, are provided for selectively connecting bit line DBL to ground, and bit line DBL' to VDD.

Figure 6:
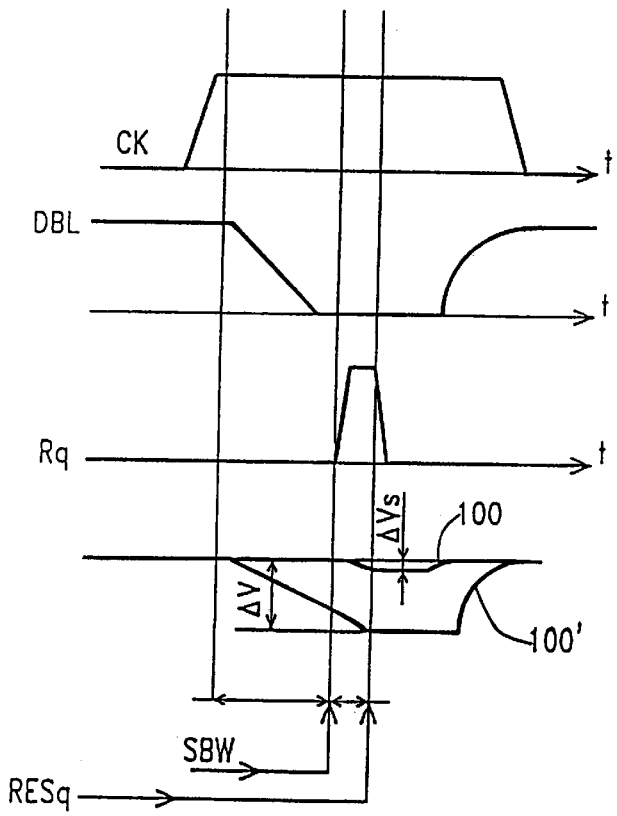
FIG. 6 is a time diagram of some signals of the circuit of FIG. 2.

The operation of the circuits previously described will be now explained with the help of the timing diagram of FIG. 6.

Before the start of a write operation of the memory device, signal PRE is activated ("0") and signal WE is deactivated ("0"). Signal EN is also deactivated ("0"), so as to keep all of the rows R1–Rn of the array deactivated (i.e., at the ground potential). As a result, transistors N3 and N4 of all of the memory cells 2 are off and nodes A and B of the memory cells are disconnected from the bit lines BL and BL'. Transistors P4 and P5 in the write and precharge circuits, as well as transistors P6 and P7 in the dummy write and precharge circuit 4', are activated, and all of the bit lines BL and BL' and the dummy bit lines DBL and DBL' are connected to (and precharged at) VDD. Transistors N5 and N6 of the dummy memory cells DMC0–DMCn are off, and nodes A and B of the dummy cells are disconnected from the dummy bit lines DBL and DBL'; however, the pre-set transistors P3 are on, and nodes A of the dummy memory cells are connected to VDD. In this manner, the dummy memory cells are preset in the state A="1", B="0".

At the rising edge of clock signal CK (FIG. 6) signal PRE is deactivated ("1"). Transistors P4 and P5 in the write and precharge circuits of the columns are turned off, so that all of the bit lines BL and BL' of the array are disconnected from VDD. The same holds true for the dummy column; P6 and P7 in the dummy write and precharge circuit are turned off and the dummy bit lines DBL and DBL' are disconnected from VDD.

Subsequently, control circuit 5 activates signal WE ("1") to start the write operation. In the write and precharge circuits associated with the selected columns (CSi="1"), N7 and N8 are turned on. According to the logic value of Dj, the bit lines BL and BL' of a selected column Ci are either kept at VDD or are discharged; for example, if in column Ci Dj="0", the bit line BL of that column is discharged. If instead Dj="1", it is the bit line BL' that is discharged. The bit lines of the unselected columns (CSi="0") remain charged at VDD.

The activation of signal WE always causes the dummy bit line DBL of the dummy column DC to be discharged.

The discharge time of DBL is substantially identical to the discharge time of a generic bit line BL or BL' of the array. When the potential of DBL falls below a threshold of level detector DET1, signal SBW is activated to inform control circuit 5 that the bit lines of the array to be discharged have reached the desired voltage. Control circuit 5 then activates signal EN ("1"), so that the potential of the addressed row Rq (FIG. 6) of the memory array (i.e. the row for which the respective selection signal RS1–RSn is activated) is driven high by the respective driver RD1–RDn; also, activation of signal EN causes the selection of the dummy row DR.

Selection of the addressed row Rq causes the activation of transistors N3 and N4 in all the memory cells 2 and transistors N5 and N6 in the dummy cell DMC belonging to the row; similarly, selection of the dummy row causes the activation of transistors N5 and N6 of the dummy memory cell DMC0 belonging to the dummy row.

During the precharge phase, before the rising edge of CK, the dummy memory cells DMC0–DMCn are all preset in the condition A="1", B="0" (by means of the presetting transistors P3). Also, the dummy write and precharge circuit 4' is designed such that the potential of bit line DBL is set to "0", upon the actuation of the write signal WE. As a result, after the selection of the addressed row R1–Rn and of the dummy row DR, the data stored in the dummy memory cells DMC of the dummy column DC must change from A="1", B="0" to A="0", B="1". At the same time, those memory cells 2 of the selected row and belonging to the selected columns which store a datum opposite to that which is desired to be programmed must change their state. In the unselected columns, one of the two complementary bit lines BL or BL' will always be discharged.

The dummy memory cell DMC1–DMCn belonging to the selected row serves to monitor the change of the state of the memory cells 2 which are to be programmed. As soon as signal RES1–RESn (the potential of node A of the dummy cell) falls below the threshold voltage of the NAND gate RD1–RDn of the respective row driver circuit, it is assumed (since the dummy memory cell is substantially identical to the other memory cells 2 of the row) that also the other memory cells 2 of the row have changed their programming state. The row selection signal R1–Rn is thus deactivated by RES1–RESn, and the transistors N3 and N4 of all the memory cells 2 of the row are turned off. In this way, the bit lines BL or BL' of the unselected columns are not completely discharged, because the row remains selected only for a time sufficient to cause the memory cells to be programmed to change their state.

The change of state of the dummy memory cell DMC0 of the dummy row cause the level detector DET2 to activate signal ENDW, which in turn causes the control circuit 5 to reset by deactivating signals EN and WE and activating signal PRE. By providing the dummy column DC physically adjacent to the row driver circuits RD1–RDn of the row decoder circuit, the disabling of the row driver after the change of state of the respective dummy memory cell is almost instantaneous; signal ENDW instead propagates a greater distance from the dummy row to the control circuit, so that a suitable delay is provided between the activation of one of signals RES1–RESn and the deactivation of signal EN by control circuit 5.

In this way, as shown by curves 100 and 100' in FIG. 6, the voltage swing $\Delta V_s$ of unselected bit lines (curve 100) is much less than the voltage swing $\Delta V$ of unselected bit lines in the prior art circuits (curve 100'), because the time interval during which the accessed row Rq remains enabled is shorter.

In another embodiment of the present invention, it is possible to omit the dummy row shown in FIG. 2. Signal ENDW, used for resetting the control circuit 5, is provided, for example, by OR-ing together all the signals RES1–RESn.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. A memory device comprising:
    an array of data memory cells arranged in data rows and data columns;
    a plurality of gates for transmitting respective row selection outputs of a row decoder to respective rows;
    a dummy column of dummy memory cells substantially identical to the data memory cells;
    precharge means for precharging the data columns and the dummy column at a precharge potential when no data row is selected;
    programming means for setting selected data columns at respective programming potentials;
    dummy memory cell preset means for presetting the dummy memory cells in a first logic state when no data row is selected;
    dummy column programming means for setting the dummy column to a second logic state opposite to the first logic state; and
    first detector means for detecting that the dummy column has discharged from the precharge potential to the second logic state and for consequently enabling the plurality of gates,
    wherein each of the gates has an input coupled to a respective dummy memory cell so that the gate is disabled as soon as the respective dummy memory cell has switched from the first logic state to the second logic state.

2. The memory device according to claim 1, further comprising:
    a dummy row including a first dummy memory cell of the dummy column, the dummy row being selected when the plurality of gates is enabled; and second detector means for detecting that the first dummy memory cell has switched from the first to the second logic state and for consequently disabling the plurality of gates.

3. The memory device according to claim 2, further comprising control means for activating the programming means and dummy column programming means in response to a clock signal, the control means being supplied by the first and second detector means and supplying a common enable signal to the plurality of gates and to a dummy row gate for enabling the plurality of gates and the dummy row gate.

4. The memory device according to claim 3, wherein each of the data memory cells and dummy memory cells includes:
a bistable element having first and second nodes and storing complementary data;
first and second selection means for respectively coupling the first and second nodes to a first and second complementary bit line of a respective data column or, respectively of the dummy column, the first and second selection means being commonly controlled by one of the row selection outputs from a respective one of the plurality of gates.

5. A memory device comprising:
an array of data memory cells arranged in data rows and data columns;
a plurality of gates for transmitting respective row selection outputs of a row decoder to respective rows;
a dummy column of dummy memory cells substantially identical to the data memory cells;
precharge means for precharging the data columns and the dummy column at a precharge potential when no data row is selected;
programming means for setting selected data columns at respective programming potentials;
dummy memory cell preset means for presetting the dummy memory cells in a first logic state when no data row is selected;
dummy column programming means for setting the dummy column to a second logic state opposite to the first logic state;
first detector means for detecting that the dummy column has discharged from the precharge potential to the second logic state and for consequently enabling the plurality of gates;
a dummy row including a first dummy memory cell of the dummy column, the dummy row being selected when the plurality of gates is enabled;
second detector means for detecting that the first dummy memory cell has switched from the first logic state to the second logic state and for consequently disabling the plurality of gates; and
control means for activating the programming means and dummy column programming means in response to a clock signal, the control means being supplied by the first and second detector means and supplying a common enable signal to the plurality of gates and to a dummy row gate for enabling the plurality of gates and the dummy row gate,
wherein:
each of the gates has an input coupled to a respective dummy memory cell so that the gate is disabled as soon as the respective dummy memory cell has switched from the first logic state to the second logic state;
each of the data memory cells and dummy memory cells includes:
a bistable element having first and second nodes and storing complementary data;
and
first and second selection means for respectively coupling the first and second nodes to a first and second complementary bit line of a respective data column or, respectively, of the dummy column, the first and second selection means being commonly controlled by one of the row selection outputs from a respective one of the plurality of gates;
each gate of the plurality of gates has an input coupled to the first node of the respective dummy memory cell; and
the second detector means is coupled to the first node of the first dummy memory cell.

6. The memory device according to claim 5, wherein the bistable element includes a pair of cross-coupled inverters, the first node being an output of a first inverter of the pair and the second node being an output of a second inverter of the pair.

7. The memory device according to claim 6, wherein the first and second inverters are CMOS inverters.

8. The memory device according to claim 7, wherein the first and second selection means each includes a transistor having first and second terminals, the first terminal connected to one of the first node and the second node, respectively, of the bistable element and the second terminal connected to one of the first complementary bit line and the second complementary bit line, respectively, the transistor having a control terminal connected to one of the row selection outputs.

9. A method for programming a memory device comprising a matrix of data memory cells arranged in data rows and data columns and a dummy column of dummy memory cells substantially identical to the data memory cells, the method comprising steps of:
precharging the data columns and the dummy column to a precharge potential when no data row is selected, and simultaneously presetting the dummy memory cells to a first logic state;
setting selected data columns to respective programming potentials corresponding to data to be programmed into the data memory cells, before selecting a data row, and setting the dummy column to a second logic state opposite to the first logic state;
waiting until the dummy column has discharged to the second logic state;
enabling a selected data row for transferring the data to be programmed to the data memory cells belonging to the selected data row and to the selected data columns; and
disabling the selected data row as soon as the dummy memory cell associated with the selected data row has switched from the first to the second logic state.

10. A memory device comprising:
an array of memory cells arranged in a plurality of rows and a plurality of columns;
a row decoder circuit to select predetermined rows of the array;
a column decoder circuit to select a predetermined group of columns of the array and to program the memory cells associated with the predetermined group; and
a control circuit to control the row decoder circuit and the column decoder circuit during a read operation and a write operation to the array and to control a row enable time associated with the row decoder circuit during the write operation.

11. The memory device according to claim 10, wherein the array further includes a dummy column of dummy memory cells substantially similar to the memory cells.

12. The memory device according to claim 11, wherein the dummy memory cells include preset means for presetting the dummy memory cells to a first logic state when no row is selected by the row decoder circuit.

13. The memory device according to claim 12, wherein the row decoder circuit includes a plurality of row drivers each enabled by the control circuit to respectively select the predetermined rows.

14. The memory device according to claim 13, wherein the column decoder circuit includes:

a precharge circuit to set the plurality of columns and the dummy column to a precharge state when no row is selected by the row decoder circuit;

a write circuit to set each memory cell associated with the predetermined group to a respective programmed data state; and a dummy column write circuit to set the dummy column to a second logic state opposite to the first logic state.

15. The memory device according to claim 14, wherein each row driver has an input coupled to a respective dummy memory cell so that the row driver is disabled when the respective dummy memory cell has switched from the first logic state to the second logic state.

16. The memory device according to claim 15, wherein the control circuit includes a first detector circuit to detect a dummy column threshold state between the precharge state and the second logic state.

17. The memory device according to claim 16, wherein the control circuit controls the row enable time by enabling the plurality of row drivers when the first detector circuit detects the dummy column threshold state.

18. The memory device according to claim 17, wherein the array further comprises a dummy row including a first dummy memory cell of the dummy column.

19. The memory device according to claim 18, wherein the dummy row is selected by the control circuit when the control circuit enables the plurality of row drivers.

20. The memory device according to claim 19, wherein the control circuit further includes a second detector circuit to detect that the first dummy memory cell has switched from the first to the second logic state.

21. The memory device according to claim 20, wherein the control circuit is reset when the second detector circuit detects that the first dummy memory cell has switched from the first to the second logic state.

22. The memory device according to claim 21, wherein the dummy column is physically adjacent to the plurality of row drivers.

23. A method for reducing power dissipation in a memory device including memory cells arranged in rows and columns, comprising a step of controlling the width of a time pulse that enables the rows for a write operation to the memory cells.

24. The method according to claim 23, wherein:

the memory device further includes a dummy column of dummy memory cells substantially similar to the memory cells; and the step of controlling the width of a time pulse includes the steps of:

setting the dummy column to a precharge state;

setting the dummy memory cells to a first logic state;

setting the dummy column to a second logic state opposite to the first logic state;

detecting a threshold state of the dummy column as the dummy column changes from the precharge state to the second logic state;

enabling the rows after the threshold state has been detected; and disabling a particular row when the dummy memory cell associated with the particular row changes from the first logic state to the second logic state.

25. The method according to claim 24, further including the step of disabling all of the rows when any of the dummy memory cells changes from the first logic state to the second logic state.

26. The method according to claim 24, further including the step of disabling all of the rows following a suitable delay after the step of disabling a particular row.

27. The method according to claim 26, wherein:

the memory device further comprises a dummy row including a first dummy memory cell of the dummy column; and the step of disabling all of the rows includes the step of detecting when the first dummy memory cell has switched from the first logic state to the second logic state.

28. A memory device comprising:

an array of data memory cells arranged in data rows and data columns;

a plurality of gates for transmitting respective row selection outputs of a row decoder to respective rows;

a dummy column of dummy memory cells substantially identical to the data memory cells;

precharge means for precharging the data columns and the dummy column at a precharge potential when no data row is selected;

programming means for setting selected data columns at respective programming potentials;

dummy memory cell preset means for presetting the dummy memory cells in a first logic state when no data row is selected;

dummy column programming means for setting the dummy column to a second logic state opposite to the first logic state;

first detector means for detecting that the dummy column has discharged from the precharge potential to the second logic state and for consequently enabling the plurality of gates;

a dummy row including a first dummy memory cell of the dummy column, the dummy row being selected when the plurality of gates is enabled; and second detector means for detecting that the first dummy memory cell has switched from the first logic state to the second logic state and for consequently disabling the plurality of gates, wherein each of the gates has an input coupled to a respective dummy memory cell so that the gate is disabled as soon as the respective dummy memory cell has switched from the first logic state to the second logic state.

* * * * *